United States Patent
Mattsson et al.

(10) Patent No.: US 7,161,090 B2
(45) Date of Patent: Jan. 9, 2007

(54) ELEMENT FOR ELECTROMAGNETIC SHIELDING AND METHOD FOR MANUFACTURING THEREOF

(75) Inventors: Magnus Mattsson, Örebro (SE); Mikael Jacobsson, Örebro (SE)

(73) Assignee: Nolato Silikonteknik AB, Hallsberg (SE)

( * ) Notice: Subject to any disclaimer, the term of this patent is extended or adjusted under 35 U.S.C. 154(b) by 57 days.

(21) Appl. No.: 10/432,929

(22) PCT Filed: Oct. 23, 2002

(86) PCT No.: PCT/SE02/01926

§ 371 (c)(1),
(2), (4) Date: May 28, 2003

(87) PCT Pub. No.: WO03/037057

PCT Pub. Date: May 1, 2003

(65) Prior Publication Data

US 2004/0026100 A1    Feb. 12, 2004

(30) Foreign Application Priority Data

Oct. 26, 2001    (SE)  .................................... 0103597

(51) Int. Cl.
 *H05K 9/00*    (2006.01)
(52) U.S. Cl. ...................................... 174/350; 174/353

(58) Field of Classification Search ........... 174/35 MS, 174/35 R, 350, 353; 264/437, 108, 272.11
See application file for complete search history.

(56) References Cited

U.S. PATENT DOCUMENTS

| | | | |
|---|---|---|---|
| 2,849,312 A | | 8/1958 | Peterman |
| 4,778,635 A | | 10/1988 | Hechtman et al. |
| 5,006,397 A | * | 4/1991 | Durand ........................ 428/209 |
| 5,522,962 A | * | 6/1996 | Koskenmaki et al. .... 156/272.4 |
| 5,851,644 A | * | 12/1998 | McArdle et al. ............ 428/213 |
| 5,882,729 A | | 3/1999 | Kahl et al. |
| 6,121,545 A | | 9/2000 | Peng et al. |

FOREIGN PATENT DOCUMENTS

GB         2 049 718         12/1980

\* cited by examiner

*Primary Examiner*—Jinhee Lee
(74) *Attorney, Agent, or Firm*—Buchanan Ingersoll & Rooney PC

(57) ABSTRACT

A method for manufacturing an element for electromagnetic shielding. The method is characterized by the steps of arranging, along a curve corresponding to the extension of the completed element, a viscous material in the form of a bead, and orienting the particles in the material by applying a magnetic field across the bead. The material carries particles with substantial electrical conductivity and also ferromagnetic and/or ferrimagnetic properties. Also disclosed are a corresponding element for electromagnetic shielding, a device for electromagnetic shielding including such an element, use of such an element in a mobile phone and at a base station, and also a mobile phone and a base station including such an element.

29 Claims, 3 Drawing Sheets

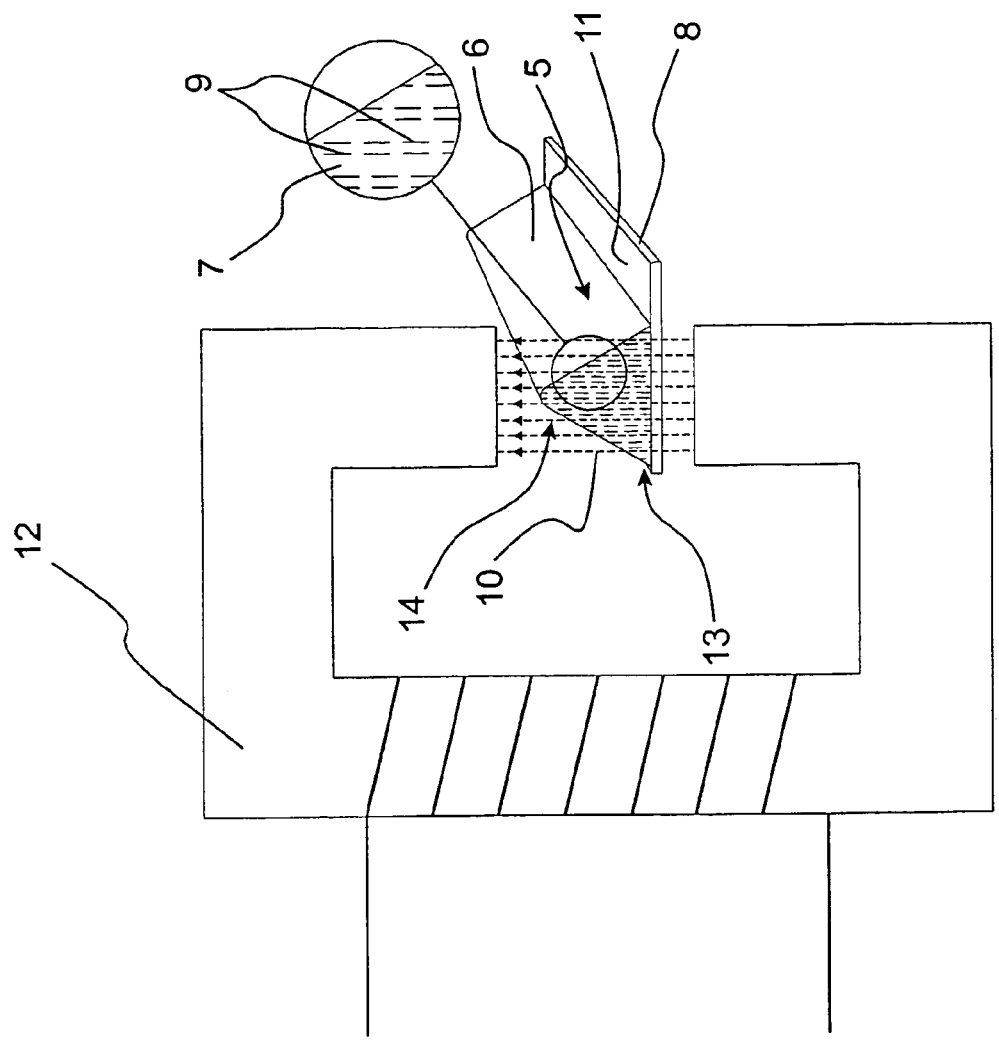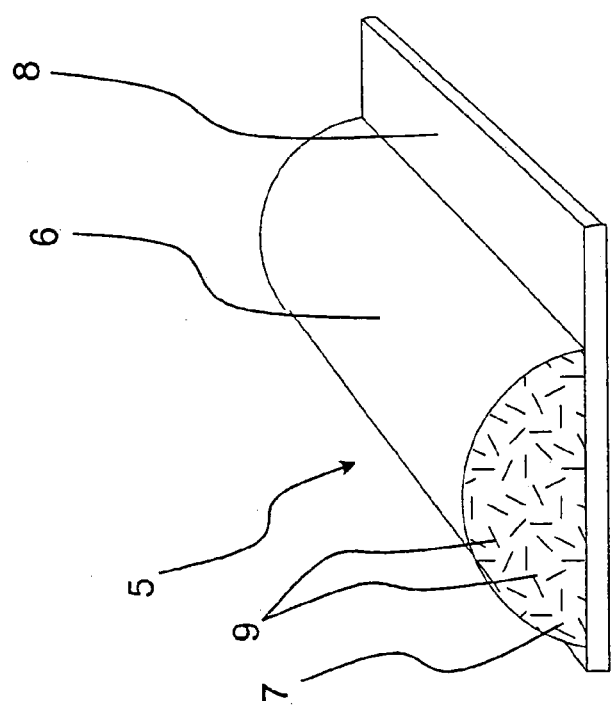

ELEMENT FOR ELECTROMAGNETIC SHIELDING AND METHOD FOR MANUFACTURING THEREOF

FIELD OF THE INVENTION

The present invention relates to an element for electromagnetic shielding, a method for manufacturing thereof and a device comprising such an element. More specifically, the invention concerns such an element for electromagnetic shielding, comprising an elastic material which carries particles with substantial electrical conductivity.

BACKGROUND ART

For expedient function, electronic-equipment must, usually be shielded from electromagnetic radiation. The equipment may also comprise components which themselves generate electromagnetic radiation that must be shielded.

To provide such shielding, the electronic equipment, or its components, is normally enclosed in casings with electrical conductivity, which consequently act as a Faraday cage.

To allow access to the electronic equipment or its components, these casings are usually made to be opened, in which case elastic elements of the type described by way of introduction are used to ensure the necessary shielding.

Such an element is known from, for example, GB 2049718. The element described comprises an elastic, electrically non-conductive material which carries electrically conductive flakes. The flakes are oriented to increase the conductivity of the element in a certain direction. To achieve this orientation, the material, when still viscous, is subjected to a shearing process, which can be effected by extrusion. Subsequently, the material is allowed to cure, after which the material is sliced in a direction which is preferably perpendicular to the direction of extrusion. The completed element is finally punched from the slices of material. Although the thus manufactured elements for electromagnetic shielding have an advantageous conductivity in a desired direction, they are difficult to manufacture and besides it is difficult to provide more complicated designs of the elements.

Moreover, a casing with an elastic element of the type described by way of introduction is known from, for example, U.S. Pat. No. 5,882,729.

The element described in the above publication is manufactured by dispensing a viscous material carrying particles with substantial electrical conductivity on a housing. The viscous material is dispensed in the form of a bead of the required extension, after which the material is treated to assume an elastic, non-viscous state. The element ensures good electric contact between the housing and a cover when this is closed and caused to abut against the element.

A problem with elements of this type is that the particles that provide the electrical conductivity of the element are relatively expensive. It would therefore be desirable to reduce the amount of particles which is included in the element.

Furthermore, for dispensing to be possible, the material must have a relatively low viscosity. As a result, the dispensed bead will have a shape corresponding to a lying D.

A thus designed element requires a relatively high compression force to achieve the necessary electric contact between, for instance, a housing and a cover.

In many fields, it is required that the electronic equipment be made increasingly smaller. For instance, there is an ongoing development towards manufacture of smaller, thinner and lighter mobile phones. Unnecessarily high compression forces may in this context cause deformation of the casing of the mobile phone.

Also in shielding covers for base stations for mobile telephony there is a need for lowered compression forces in shielding elements, since the now prevailing relatively high compression forces require expensive stiffeners and/or great wall thicknesses.

There is thus a need for elements that require lower compression forces. The solution suggested in U.S. Pat. No. 5,882,729 is dispensing of a plurality of beads, thereby building a vertically tapering element. It will be appreciated that this is a complicated and time-consuming process which has a detrimental effect on the cost of manufacture of the element.

A further method of making thus tapering elements is injection moulding, but this is not a practically applicable method for surface-sensitive or large components.

Finally it is known from U.S. Pat. No. 4,778,635 to make a material with anisotropic electrical conductivity by subjecting a viscous material, which carries electrically conductive particles, to a spatially varying magnetic field while at the same time the material cures. More specifically, the varying magnetic field affects the particles so that they are concentrated in beads whose positions are locked as the material cures.

SUMMARY OF THE INVENTION

In view of the above, an object of the present invention is to provide an improved element for electromagnetic shielding and a corresponding method for manufacturing thereof.

Another object is to provide an improved device for electromagnetic shielding comprising such an element.

The element should preferably have good electrical conductivity in spite of a reduced particle content.

The element should also preferably require a reduced compression force.

To achieve these objects, and also other objects that are evident from the following description, a method is provided according to the present invention for manufacturing an element for electromagnetic shielding, a device for electromagnetic shielding, an element for electromagnetic shielding, use of an element, a mobile phone, and a base station.

More specifically, according to the present invention a method is provided for manufacturing an element for electromagnetic shielding, which method is characterised by the steps of arranging a viscous material in the form of a longitudinally extended bead, the material carrying particles with substantial electrical conductivity and ferromagnetic and/or ferrimagnetic properties, and orienting the particles in the material by applying a magnetic field across said bead.

By the term viscous material which is used above and in the following is meant a sticky, viscous material. Such a material can, for instance at a shear rate of $10^{-1}$ s, have a viscosity in the range 30–300 Pas.

This results in an improved method for manufacturing an element for electromagnetic shielding. Owing to the fact that the particles are oriented by applying a magnetic field, the electrical conductivity of the element is improved. More specifically, the particles will be arranged in rows along the field lines of the magnetic field. It will thus be possible to provide a given conductivity with a reduced amount of particles. Since the cost of said particles constitutes a main part of the total cost of material for the element, this reduced need for particles results in a considerable saving in costs. An element with a reduced particle content requires also a lower compression force. The reason is that the particles act to reinforce the material of the element. Thus, a reduced particle content results in reduced reinforcement.

The inventive method comprises advantageously also the step of treating the bead in such a manner that the material assumes an elastic, non-viscous state, whereby the particles are fixed with maintained orientation. Advantageously the material is selected from the group consisting of silicone rubber, polyurethane and TPE (i.e. thermoplastic elastomer). If the material is silicone rubber, the material is treated by a curing process, whereby it assumes an elastic, nonviscous state while the particles are fixed with maintained orientation.

According to a preferred embodiment of the inventive method, the magnetic field applied across the bead is given such a strength and/or duration that the particles, during their orientation in the same direction as the magnetic field, affect the geometry of the bead. The magnetic field is advantageously directed so that the particles, during their orientation, affect the material of the bead in such a manner that the bead assumes a geometry tapering from a base towards an apex. A thus designed element requires a reduced compression force.

According to another preferred embodiment, the magnetic field applied across the bead is given such a strength and/or duration that a concentration of particles is provided in the surface layer of the bead. In some cases, it is in fact in the surface of the element that the need for substantial electrical conductivity is at its greatest. The magnetic field treatment thus makes it possible to ensure that the requisite conductivity is provided in said surface layer while the particle content of the other parts of the material can be brought to a minimum. This means that the particle need may be further reduced, which has a positive effect on the manufacturing cost as well as the required compression force.

According to yet another preferred embodiment of the present invention, said bead is made by a dispensing process. Alternatively, the bead can be made by a screen-printing process.

The material is advantageously arranged in the form of a bead on a substrate and is arranged for adhesion thereto. The magnetic field is advantageously directed so as to act perpendicular to and in a direction away from the surface of the substrate, on which surface the material is arranged.

The magnetic field applied across the bead preferably has a flux density in the range 0.01–1 Tesla.

The particles are preferably formed so as to contain a ferromagnetic material such as iron, nickel, cobalt, or an alloy containing one or more of said ferromagnetic materials.

The particles are preferably also formed with an outer layer of a material having substantial electrical conductivity.

The outer layer preferably forms also an oxidation inhibitor for a ferro- and/or ferromagnetic material arranged inside the outer layer.

Furthermore, according to the present invention a method is provided for manufacturing an electromagnetic shielding element, which method is characterised by the steps of arranging, by a dispensing process, a bead of a viscous material, such as silicone rubber, and particles carried therein and having substantial electrical conductivity and ferro- and/or ferromagnetic properties on a substrate, orienting the particles carried by the material by applying a magnetic field across the bead, the magnetic field being directed so as to act perpendicular to the substrate in a direction away from the surface of the substrate, on which surface said bead is arranged, and treating the material so as to assume an elastic, non-viscous state.

Further a device for electromagnetic shielding is provided, comprising an element made according to the method as described above.

According to the invention, also an element for electromagnetic shielding is provided, comprising an elastic material which carries particles with substantially electrical conductivity, which element is characterised in that the particles are oriented in the material.

Thus, an element is provided which has extremely good electrical conductivity in relation to particle content. To achieve a given conductivity, it will thus be possible to reduce the particle content, which has a positive effect on the manufacturing cost. Also the force required for compressing the material is reduced.

According to a preferred embodiment of the element, said particles are oriented so that a concentration of particles is present in a surface layer of the material.

The material included in the element preferably consists of silicone rubber, polyurethane or TPE (i.e. thermoplastic elastomer).

According to another preferred embodiment, the particles have ferro- and/or ferrimagnetic properties. This makes it possible to achieve said orientation of the particles by applying a magnetic field across the element when its material is present in a viscous state. The particles advantageously contain nickel, iron, cobalt, or an alloy containing one or more of these.

According to one more preferred embodiment, the particles have an outer oxidation-inhibiting layer with substantial electrical conductivity, the oxidation-inhibiting layer preferably containing silver.

According to another embodiment, the element has a shape tapering from a base towards an apex. This reduces the force required for compressing the element.

According to one more embodiment, the elastic material also carries particles with substantial electrical conductivity and without ferro- or ferrimagnetic properties.

According to the present invention, there are also provided use of an element as described above for electromagnetic shielding in a mobile phone, and a mobile phone containing such an element.

Finally, according to the present invention, there are provided use of an element as described above for electromagnetic shielding at a base station, and also a base station containing such an element.

The present invention will now be described by way of example and with reference to the accompanying drawings.

BRIEF DESCRIPTION OF THE DRAWINGS

FIG. 2 is a part-sectional perspective view of an element for electromagnetic shielding in a state before its particles have been oriented according to the present invention.

FIG. 3 is a schematic view of the process for orienting the particles in the element shown in FIG. 2.

DESCRIPTION OF THE EMBODIMENTS

Figure 1:
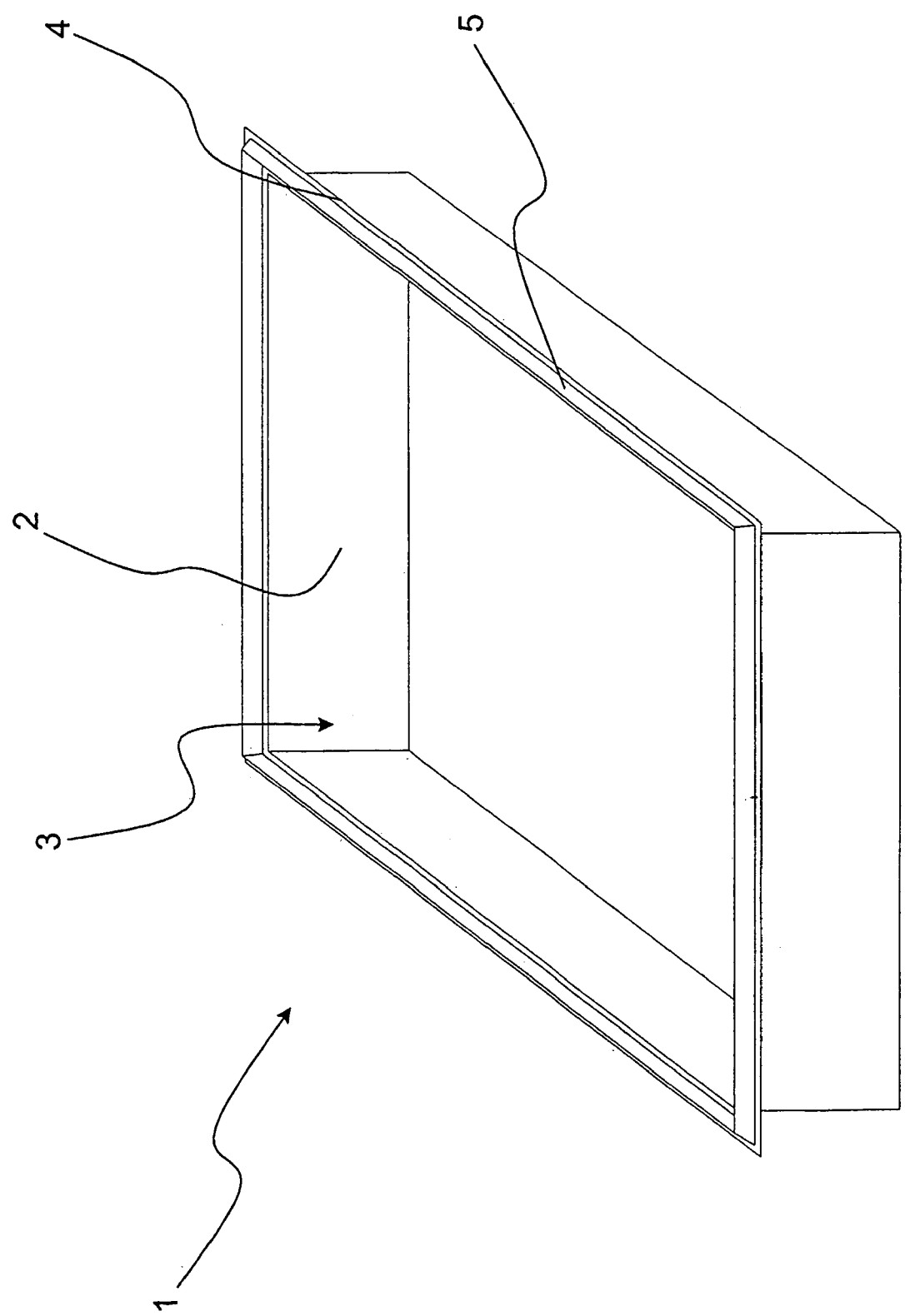
FIG. 1 is a perspective view of an inventive shielding device with an element for electromagnetic shielding.

FIG. 1, to which reference is made, illustrates an inventive device 1 for electromagnetic shielding.

The device 1 comprises a casing 2 with an opening 3 and a flange 4 surrounding the opening 3. The casing 2 has substantial electrical conductivity and can thus be made of metal or metallised plastic. The casing 2 may also comprise a body without substantial conductivity, in which case a layer of substantial conductivity is applied to the inner and/or outer surface of the casing 2.

The device 1 further has an element 5, which is applied to the circumferential flange 4 and has a shape tapering from a base towards an apex. The tapering shape means that the force required for compressing the element 5, and thus providing good electric contact, is reduced.

The element 5 is made of an elastic material which carries particles with substantial electrical conductivity. According to a preferred embodiment, the elastic material consists of silicone rubber while the particles consist of nickel with an outer silver layer. The element 5 and the method for manufacturing thereof will be described in more detail below.

The device 1 for electromagnetic shielding can be used for shielding electronic equipment (not shown), such as a base station for mobile telephony. The equipment is arranged in the casing 2 after which it is closed with a suitably designed cover (not shown). The element 5 ensures that good electric contact is provided between the casing 2 and the cover.

The inventive device 1 can also be used for shielding of electronics in electronic equipment such as one or more components on a printed circuit board (not shown). The device 1 forms a casing 2 which is applied over the group of components, the element 5 ensuring that good electric contact between the casing 2 and the printed circuit board is provided.

The size of the inventive device 1 is of course adapted to the technical field in question.

It will be appreciated that the device 1 can also be configured in other ways. For example, it is possible to make the device 1 in the form of a frame which on opposite sides supports an element 5 for electromagnetic shielding, which elements are in electric contact with each other. The frame may then be used, for instance, as a spacer in a mobile phone, such as between two printed circuit boards or between a front and a back of the cover of the mobile phone.

FIG. 2, to which reference is now made, illustrates the appearance of an inventive element 5 during the manufacturing process.

A bead 6 of a viscous material 7, such as silicone rubber, is applied to a substrate 8 by a dispensing process, in which the material 7 is ejected through a needle nozzle (not shown) which is advanced over the substrate 8 along a curve corresponding to the extension of the completed element 5. To ensure good adhesion between the bead of material 6 and the substrate 8, a primer can be applied to the substrate 8 before dispensing of the bead 6.

For such a dispensing process to be allowed, the material 7 must have a relatively high viscosity, whereby the material 7, owing to gravity, will assume the shape of a lying D. Preferably the material has a viscosity in the range 30–300 Pas at a shear rate of $10^{-1}$ s when measuring in a rheometer Physica-Rheolab MC1 with a plate/plate measuring system.

The material 7 carries particles 9 with substantial electrical conductivity and ferro- and/or ferrimagnetic properties.

According to the preferred embodiment, the particles 9 consist of nickel with an outer silver layer. Nickel is ferromagnetic while the silver layer acts as an oxidation inhibitor for the nickel. The silver also promotes the improvement of the electrical conductivity of the particles 9.

The particles are preferably spherical, round, needle-shaped or lump-shaped, such as irregular granules.

FIG. 3, to which reference is now also made, illustrates the next step for manufacturing the inventive element 5.

The magnetic field 10 is applied across the material 7 arranged in the form of a bead 6. The magnetic field 10 is directed so as to act perpendicular to the substrate 8 away from the surface 11 on which the material 7 is arranged. The Figure illustrates how the magnetic field 10 is applied by means of an electromagnet 12. However, it will be appreciated that the magnetic field 10 can be provided in other ways.

Owing to the ferromagnetic properties of the particles 9, the particles will be affected by the magnetic field 10 and orient themselves in the same direction as the magnetic field 10. More specifically, the particles 9 will be oriented in rows extended along the field lines of the magnetic field 10. The orientation of the particles in rows is clearly to be seen from the enlargement of a detail in FIG. 3.

The orientation of the particles is facilitated by their advantageous shapes stated above. In the FIGURES, the particles are needle-shaped in order to clearly illustrate their orientation caused by the magnetic field.

The orientation of the particles 9 promotes improvement of the electrical conductivity of the element 5. Owing to said magnetic field treatment, it is thus possible to reduce the amount of particles 9 for providing a given conductivity in the element 5. This means a considerable saving in costs. The reduced amount of particles 9 also implies that the force required for compressing the element 5 is reduced since the particles 9 cause a reinforcement of the material 7. It goes without saying that a reduced amount of particles 9 will result in a smaller reinforcement.

By a suitable adaptation of the flux density of the magnetic field 10 it will be possible to cause the particles 9, during their orientation, to affect the material 7 of the bead 6 in such a manner that the bead 6 changes its geometry. It is evident from FIG. 3 how the bead 6 has assumed an essentially triangular geometry with a shape tapering from a base 13 towards an apex 14. Thus the magnetic field 10 affects the particles 9 so that the particles during their orientation in turn act on the material 7 and extend it in the vertical direction.

The magnetic field has a field strength preferably in the range 0.01–1 Tesla.

Subsequently the material 7 is treated in a suitable manner to make it assume an elastic, non-viscous state, whereby the particles 9 are fixed with maintained orientation. If the material 7 consists of silicone rubber, this is subjected to a conventional curing process.

In a practical experiment, a bead 6 of silicone rubber was dispensed on a substrate 8. The silicone rubber carried particles 9 in the form of nickel with an outer silver layer. The particles had a diameter in the range 10–100 μm, average diameter 40 μm. The bead 6 assumed essentially the shape of a lying D, width 1.3 mm and height 0.8 mm. Then a magnetic field 10 with a magnetic flux density of 0.05 Tesla was applied across the bead 6 for 15 s in the manner as described above. The bead 6 thereby assumed a triangular shape with a height of 1.3 mm.

According to the present invention, an element 5 for electromagnetic shielding and also a method for manufacturing thereof are provided. The element 5 comprises an elastic material 7 which carries oriented particles 9 with substantial electrical conductivity. Owing to the orientation of the particles 9, the element 5 can be made to have a given conductivity in spite of a reduced particle content. As a result, the manufacturing cost for the element 5 is lowered while at the same time the necessary compression force can be reduced. Said orientation is provided according to the present invention by applying a magnetic field 10 across a bead of the material 7 when in a viscous state. In connection with the orientation of the particles 9 it is also possible to affect the geometry of the bead 6.

According to a preferred embodiment of the inventive method, the bead of material can be arranged directly on a substrate and be arranged for adhesion thereto. The substrate may consist of a flange 4 of the casing shown in FIG. 1. However, other types of substrate are conceivable, such as a frame structure which is intended to be arranged between two electrically conductive structures in the form of printed circuit boards.

According to another embodiment (not shown), also particles with substantial electrical conductivity are carried by the material of the element. These electrically conductive particles help to electrically connect the particles with electrical conductivity as well as ferro- and/or ferrimagnetic properties when these are arranged in rows along the field lines of the magnetic field applied across the bead. This improves the electrical conductivity of the element still more.

The present invention is extremely useful in the mobile phone industry. There is a strong downward pressure on prices of mobile phones and therefore all savings in cost are of benefit to the manufacturers. Besides, the fact that the required compression force of the element 5 can be reduced means that the element 5 itself does not constitute a bar to designing smaller, lighter and thinner mobile phones.

The present invention is also very useful in shielding covers for base stations for mobile telephony. The reduced compression force of the inventive shielding element renders it possible to make the shielding cover with a reduced wall thickness and/or without stiffeners.

It will be appreciated that the present invention is not restricted to the embodiments described above.

Figure 4:
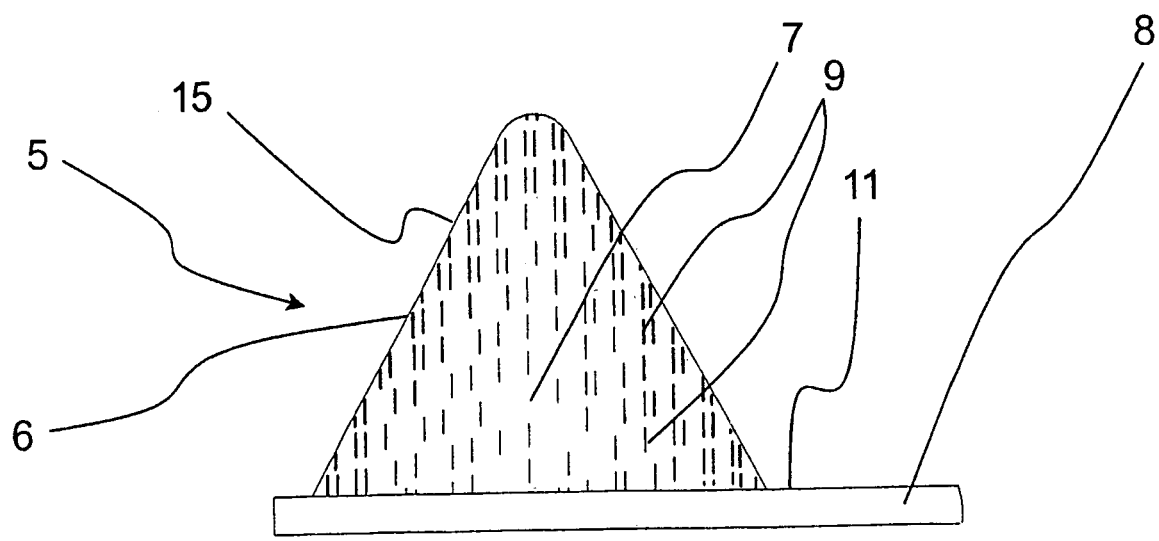
FIG. 4 is a cross-sectional view of an alternative embodiment of an inventive element for electromagnetic shielding.

For instance, it is conceivable to adjust the magnetic field 10 so that a concentration of particles 9 is provided in the surface layer 15 of the element 5, as shown in FIG. 4. The magnetic field 10 is adjusted in terms of strength and duration, whereby a great amount of the particles 9 is "extracted" from the material 7 and concentrated in its surface layer 15. A thus manufactured element 5 has extremely good electrical conductivity in the surface layer 15. This enables a further reduction of the amount of particles 9 in the material 7.

Figure 5:
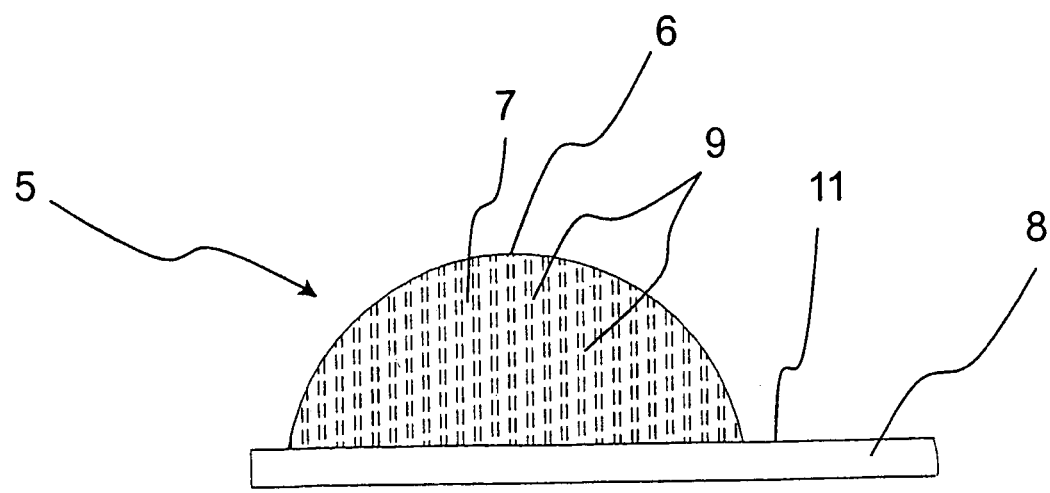
FIG. 5 is a cross-sectional view of another alternative embodiment of an inventive element for electromagnetic shielding.

It is also conceivable to adjust the magnetic field 10 so that merely an orientation of the particles 9 is provided. The magnetic field 10 is given a relatively small strength, whereby the particles 9 during their orientation are not capable of affecting the geometry of the bead,-which is shown in FIG. 5.

Nor does the elastic material have to be arranged in the form of a bead by a dispensing process. For example, it is possible to provide this bead by a screen-printing process.

It will also be appreciated that the elastic material included in the element need not necessarily consist of a silicone rubber. Thus it is also possible to manufacture the inventive element from other elastic materials, such as polyurethane, TPE (i.e. thermoplastic elastomer) or the like.

The element 5 can further be given a complex geometric configuration. To achieve this, it is possible, for instance, to dispense the particle-carrying material on a non-planar substrate, i.e. a substrate extending in three dimensions.

Finally, it will also be appreciated that the particles can be designed in a way other than that described above. The particles advantageously contain a material with ferromagnetic properties. Non-limiting examples of such materials are iron, nickel, cobalt, and alloys containing one or more of these materials. The particles may also contain materials with ferrimagnetic properties, in which case the particles preferably also contain an outer layer with substantial electrical conductivity since ferrimagnetic materials normally have lower electrical conductivity. As described above, however, also particles containing ferromagnetic material may have such an outer layer with substantial electrical conductivity. This may be required in the cases when the ferromagnetic material has a tendency to oxidation which deteriorates the electrical conductivity of the material.

Several modifications and variations are thus conceivable, and therefore the scope of the present invention is exclusively defined by the appended claims.

The invention claimed is:

1. A method for manufacturing an element for electromagnetic shielding, comprising the steps of:
arranging, along a curve corresponding to the extension of the element, a viscous material having a first external shape,
the viscous material carrying particles with substantial electrical conductivity and at least one of ferromagnetic and ferrimagnetic properties, and
orienting the particles in the viscous material by applying a magnetic field across said viscous material, wherein the magnetic field applied across the viscous material is given such a strength or duration that the particles, during their orientation in the same direction as the magnetic field, at least change the first external shape of the viscous material into a second external shape.

2. A method as claimed in claim 1, wherein the step of orienting the particles is followed by the step of treating the viscous material in such a manner that the viscous material assumes an elastic, non-viscous state, wherein the particles are fixed with maintained orientation.

3. A method as claimed in claim 1, in which the magnetic field is directed so that the particles, during their orientation, affect the viscous material in such a manner that the viscous material assumes a shape tapering from a base towards an apex.

4. A method as claimed in claim 1, in which the magnetic field applied across the viscous material is given such a strength or duration that a concentration of particles is provided in the surface layer of the viscous material.

5. A method as claimed claim 1, in which said first external shape of the viscous material is made by a dispensing process.

6. A method as claimed in claim 1, in which said first external shape of the viscous material is made by a screen-printing process.

7. A method as claimed in claim 1, in which the viscous material is arranged in the form of a bead on a substrate and arranged for adhesion thereto.

8. A method as claimed in claim 1, in which the viscous material is arranged in the form of a bead on a substrate, the magnetic field being directed so as to act perpendicular to and in a direction away from the surface of the substrate, on which surface the material is arranged.

9. A method as claimed in claim 1, in which the magnetic field applied across the viscous material has a flux density in the range of 0.01–1 Tesla.

10. A method as claimed in claim 1, in which said viscous material is selected from the group consisting of silicone rubber, polyurethane and thermoplastic elastomer (TPE).

11. A method as claimed in claim 10, in which the step of orienting the particles is followed by the step of treating the viscous material by a curing process, wherein the viscous material assumes an elastic, non-viscous state while the particles are fixed with maintained orientation.

12. A method as claimed in claim 1, in which the particles are formed so as to comprise a ferromagnetic material including iron, nickel, cobalt or an alloy containing one or more of said ferromagnetic materials.

13. A method as claimed in claim 1, in which the particles carried by the viscous material are formed with an outer layer of a material with substantial electrical conductivity.

14. A method as claimed in claim 1, in which the particles carried by the viscous material are formed with an outer layer which forms an oxidation inhibitor for a ferro- or ferrimagnetic material arranged inside the outer layer.

15. A device for electromagnetic shielding, comprising an element manufactured according to the method as claimed in claim 1.

16. An element for electromagnetic shielding manufactured in accordance with the method of claim 1, comprlslng:
an elastic material carrying parties with substantial electrical conductivity wherein
the particles are oriented in the material along field lines of a magnetic field applied across the element and the element has a shape tapering from a base towards an apex.

17. An element as claimed in claim 16, in which said particles are oriented so that a concentration of particles is present in a surface layer of the material.

18. An element as claimed in claim 16, in which the material consiste of silicone rubber, polyurethane or thermoplastic elastomer (TPE).

19. An element as claimed in claim 16, in which the particles have at least one of ferro- and ferrimagnetic properties.

20. An element as claimed in claim 19, in which the particles comprise nickel, iron, cobalt or an alloy containing one or more of these.

21. An element as claimed in claim 16, in which the particles have an outer oxidation-inhibiting layer with substantial electrical conductivity.

22. An element as claimed in claim 21, in which the oxidation-inhibiting layer contains silver.

23. An element as claimed in claim 16, in which the elastic material also carries particles with substantial electrical conductivity and without ferro- or ferrimagnetic properties.

24. A mobile phone, comprising an element for electromagnetic shielding according to claim 16.

25. A base station for mobile telephony, comprising an element according to claim 16.

26. An element as claimed in claim 17, in which the material consists of silicone rubber, polyurethane or thermoplastic elastomer (TPE).

27. A method as claimed in claim 1, wherein said magnetic field affects and orients said particles.

28. A method for manufacturing an electromagnetic shielding element, comprising the steps of:
arranging on a substrate, by a dispensing process and along a curve corresponding to the extension of the element, a length of a viscous material, including a silicone rubber, and particles carried therein and the particles having substantial electrical conductivity and at least one of ferro- and ferrimagnetic properties,
orienting the particles carried by the material by applying a magnetic field across the the viscous material, the magnetic field being directed so as to act perpendicular to the substrate in a direction away from the surface of the substrate, on which surface said viscous material is arranged, wherein the magnetic field applied across the viscous material is given such a strength or duration that the particles, during their orientation in the same direction as the magnetic field, at least change a first external shape of the viscous material into a second external shape, and
treating the viscous material so as to assume an elastic, non-viscous state.

29. A method as claimed in claim 28, wherein said magnetic field affects and orients said particles.

* * * * *